United States Patent [19]

Agarwala

[11] Patent Number: 5,376,584

[45] Date of Patent: Dec. 27, 1994

[54] PROCESS OF MAKING PAD STRUCTURE FOR SOLDER BALL LIMITING METALLURGY HAVING REDUCED EDGE STRESS

[75] Inventor: Birendra N. Agarwala, Hopewell Junction, N.Y.

[73] Assignee: International Business Machines Corporation, Reston, Va.

[21] Appl. No.: 998,982

[22] Filed: Dec. 31, 1992

[51] Int. Cl.⁵ .......................................... H01L 21/44
[52] U.S. Cl. .................................. 437/183; 437/189; 257/737; 257/780; 156/634
[58] Field of Search ................. 437/183, 189, 192; 257/737, 738, 779, 780, 763, 764; 156/633, 634, 664

[56] References Cited

U.S. PATENT DOCUMENTS

| | | | |
|---|---|---|---|
| 4,360,142 | 11/1982 | Carpenter et al. | 228/123 |
| 4,434,434 | 2/1984 | Bhattacharya et al. | 357/71 |
| 4,514,751 | 4/1985 | Bhattacharya | 257/737 |
| 5,027,188 | 6/1991 | Owada et al. | 357/68 |
| 5,137,845 | 8/1992 | Lochon et al. | 437/183 |
| 5,268,072 | 12/1993 | Agarwala et al. | 437/192 |
| 5,298,459 | 3/1994 | Arikawa et al. | 437/183 |

FOREIGN PATENT DOCUMENTS

| | | | |
|---|---|---|---|
| 0018446 | 2/1981 | Japan | 437/183 |
| 0049543 | 5/1981 | Japan | 438/183 |
| 0117135 | 7/1984 | Japan | 437/183 |
| 1120038 | 5/1989 | Japan | 257/737 |
| 1120848 | 5/1989 | Japan | 257/737 |
| 0082623 | 3/1990 | Japan | 437/183 |
| 3044935 | 2/1991 | Japan | 257/737 |

Primary Examiner—Olik Chaudhuri
Assistant Examiner—Long Pham
Attorney, Agent, or Firm—Whitham, Curtis, Whitham & McGinn

[57] ABSTRACT

A two-step masking process is disclosed for forming a ball limiting metallurgy (BLM) pad structure for a solder joint interconnection used between a support substrate and a semiconductor chip. A solder non-wettable layer and a solder wettable layer are deposited on the surface of a support substrate or semiconductor chip which are to be connected. A phased transition layer is deposited between the wettable and non-wettable layers. A thin photo-resist mask defines an area of the solder wettable and phased layers which are etched to form a raised, wettable frustum cone portion. A second mask is deposited on the surface of the support substrate or semiconductor chip, and has an opening concentrically positioned about the frustum cone. Solder is deposited in the opening and covers the frustum cone and the area about its periphery. When solidified, the solder, acting as a mask, is used to sub-etch the underlying solder non-wettable layer thereby defining the BLM pad. When reflowed, the solder beads away from the surface of the solder non-wettable layer to form a ball which securely adheres about the frustum cone.

8 Claims, 3 Drawing Sheets

PROCESS OF MAKING PAD STRUCTURE FOR SOLDER BALL LIMITING METALLURGY HAVING REDUCED EDGE STRESS

DESCRIPTION

BACKGROUND OF THE INVENTION

1. Field of the Invention

The present invention generally relates to a method for adhering a semiconductor chip to a supporting substrate and, more particularly, to a solder ball limiting metallurgy (BLM) process for improving the integrity of solder joint interconnections between a substrate and a chip.

2. Description of the Prior Art

Solder ball connections have been proven very successful for electrically connecting a semiconductor chip to a supporting substrate. Since the substrate surface is solder non-wettable, Pb/Sn (lead/tin) solder does not bond to the substrate surface directly. Hence, an intermediate pad structure must normally be used between the two surfaces to facilitate adhesion. U.S. Pat. No. 5,127,188 to Owada et al. shows an example of this type of solder joint wherein an adhesion pad, commonly known as ball limiting metallurgy (BLM), is interposed between a chip and, for example, an Sn/Pb alloy solder ball.

The solder ball fabrication could be done by use of either a dry or a wet process. In the conventional dry process, as described in U.S. Pat. No. 4,434,434 issued to Bhattacharya et al., the BLM and the solder are sequentially evaporated on the wafer surface through a thick metal or a photoresist mask. The BLM metalization typically consists of three layers of metalizations deposited in a single pump down cycle. These composite layers consist of an adhesion layer at the bottom and a solder wettable layer at the top, with an intermediate phase layer (a mixture of adhesion and wettable metalizations) between the two layers. The Cr/Phased Cr-Cu/Cu/Au metalization is often used as the BLM material and Pb-low Sn solder is a commonly used solder (sometimes called C-4 solder). Since the solder interconnection lies on top of the thin insulator layer on the chip surface and the joint is often subjected to mechanical and thermal stressing, the damage to the insulator could occur due to a localization of film stress within the joint. Specifically, the insulator damage could occur quite readily if the edges of the Cr and the Cu layers coincide. For this reason, an edge separation is needed to be maintained by extending the Cr edges beyond the Cu edges. This is done by a proper placement of the charges within the evaporator. This edge separation is needed for both the dry and the wet (plating) processes to maintain the mechanical integrity of the joint.

U.S. Pat. No. 4,360,142 to Carpenter et al. discloses a modified dry process, which uses a six layer BLM: CR/Cr-Cu phased/Cu/Cr-Cu phased/Cu/Au. During solder melting Au dissolves readily in the solder and the top Cu layer is wetted by the solder. However, due to the presence of an intervening top Cr-Cu phased layer, the bottom Cu remains unreacted. Carpenter et al. teaches that the thermal gradient in the joint can be reduced by the presence of the unreacted Cu, an excellent heat conduction material. The resulting reduction of the thermal gradient will greatly reduce the susceptibility to thermomigration, a process of atom depletion induced by the presence of a thermal gradient.

U.S. Pat. No. 4,360,142 discloses an alternative method of BLM fabrication. In this process, a blanket deposition of six layers of film is done on the wafer. Following deposition of the last layer, a layer of photoresist is formed on the surface, exposed to the desired pattern and developed. Suitable etching solutions are used to remove the exposed areas of all six layers of film to define the BLM. Subsequently, the solder is deposited via a metal mask over the BLM followed by the reflowing of the solder ball over the BLM pad. This process does not provide Cr-Cu edge separation and thus the insulator damage could readily occur in the disclosed structure.

In the wet process the solder deposition is made by electroplating the Pb-Sn solder on top of the blanket BLM metalization through the holes in a thick resist. At first, a blanket layer of Cr/phased Cr-Cu film is deposited on top of the water surface. This blanket film layer serves as the electrical contact for the electroplating. A thick layer of resist is laminated over the blanket BLM film and then hole patterns are generated by conventional lithography processes. By using the blanket film layer as a common electrical contact, the solder is then electroplated at the holes on top of the metalization layers. Next, the photoresist is stripped and the excess metalization layers are then chemically etched using the solder deposit as a mask. The etching is done sequentially by first removing the Cu layer, followed by the phased layer and then the Cr layer. Finally, in order to provide the edge separation, the Cu is etched off selectively. FIG. 1 shows this process results in an overhang of the phased layer. Specifically, FIG. 1 shows a solder wettable layer 16, intermediate phased layer 14 and a solder non-wettable layer 12 deposited on a supporting substrate 10. The wettable layer 16 and the non-wettable adhesion layer 12 are composed of different metals with the intermediate layer 14 being a phased combination of the two. A solder mass 18 is deposited over the structure. The actual BLM pad structure is defined after a series of electrochemical and chemical sub-etched processes using the solder mass 18 as a mask. The resulting structure consists of the phased layer 14 extending beyond both the non-wettable layer 12 and the wettable layer 16. As explained above, when heated, the solder mass 18 reacts with and adheres to the wettable layer 16. The layer arrangement of FIG. 1 is particularly undesirable since molten solder will come into contact with the extending edges of the phased layer 14. The phased layer 14 is a composition of wettable and non-wettable metals and could be wetted by the solder. Thus, the structure does not provide adequate edge separation between the wetted phased layer and the Cr layer. As a result, high stress concentration would develop at the BLM edges, causing insulator damage.

SUMMARY OF THE INVENTION

It is therefore an object of the present invention to increase the edge separation between layers of a BLM to reduce edge stress.

It is another object of the present invention to provide a solder interconnection with improved mechanical integrity.

It yet another object of the present invention to provide a BLM fabrication process which can be used for both solder plating and solder evaporation processes.

According to the invention, a two-step masking process is disclosed for forming a ball limiting metallurgy (BLM) pad structure for a solder joint interconnection used between a support substrate and a semiconductor chip. A solder wettable adhesion layer, and a solder wettable layer are deposited on the surface of a support substrate or semiconductor chip which are ultimately to be connected. A phased transition layer is deposited between the solder wettable and solder non-wettable layers. A thin photoresist mask defines an area over the solder wettable and phased layers which are subsequently etched to form a frustum-conical portion beneath the mask. A second resist mask which is several times thicker than the thickness of the frustum conical portion is next deposited. An opening is formed in the second mask concentrically positioned about and extending some distance beyond the frustum-conical portion. Solder is deposited either by evaporation or plating process within the opening in the second mask, and the mask is subsequently removed. The remaining solder, being concentrically positioned about the frustum-conical portion, is used as a mask to sub-etch the underlying solder non-wettable layer. Finally, the solder is reflowed (melted). When in a molten state, the solder moves away from the surface of the solder non-wettable layer to form a solder ball which integrally attaches to the wettable frustum cone portion of the BLM pad structure.

Semiconductor chips have the BLM pad structure produced by the present invention formed thereon. After the reflow, the solder integrally adheres to the wettable frustum conical portions of the BLM pad. When cooled, the resultant solder interconnection joints have reduced edge stress. Adequate edge separation is provided by controlling the relative sizes of the two resist masks.

BRIEF DESCRIPTION OF THE DRAWINGS

The foregoing and other objects, aspects and advantages will be better understood from the following detailed description of the preferred embodiments of the invention with reference to the drawings, in which.

DETAILED DESCRIPTION OF THE PREFERRED EMBODIMENTS OF THE INVENTION

This invention is related a method of forming a solder joint by a two masking step BLM process which can be adjusted to provide any level of edge separation between the various layer edges to reduce edge stress.

Figure 1:
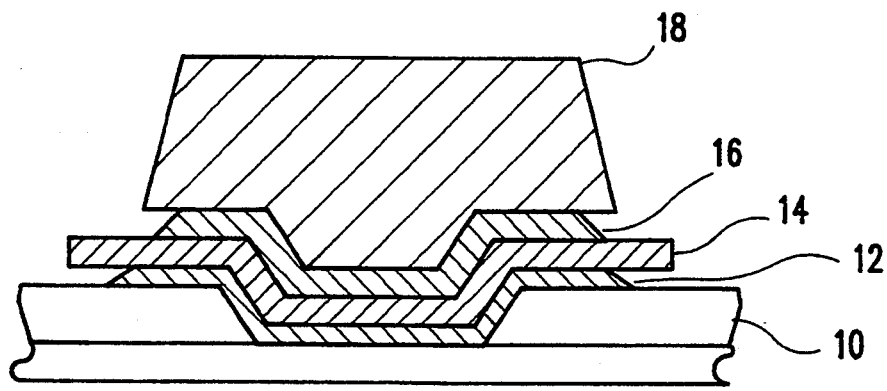
FIG. 1 is a cross-sectional side view of a prior art BLM solder interconnection.
Figure 2:
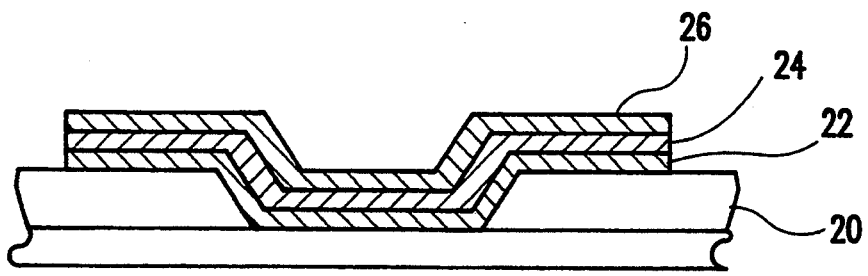
FIG. 2 cross-sectional side view of a stack of blanket layers for a BLM pad.

Referring now to the drawings, and more particularly to FIG. 2, there is shown a supporting substrate 20 to which a semiconductor chip is to be electrically and mechanically connected by a solder joint. Three blanket layers, including a solder non-wettable adhesion layer 22, a phased layer 24, and a solder wettable layer 26, are sequentially deposited onto substrate surface 20. Any number of well known deposition methods may be used to accomplish this, such as, for example, physical vapor deposition or sputtering. The non-wettable layer 22 may be, for example, chromium (Cr), titanium (Ti), Zirconium (Zr), molybdenum (Mo), tantalum (Ta), or any other metal or alloy which will adhere to the surface of the supporting substrate 20 or semiconductor chip (not shown). The wettable layer 26 may be, for example, copper (Cu), cobalt (Co), nickel (Ni), platinum (Pt), palladium (Pd), or any other metal or alloy which is wettable by molten solder. Phased layer 24 is a transition layer between non-wettable layer 22 and wettable layer 26 and is comprised of a phased combination of the two metals making up the layers 22 and 26.

Figure 3:
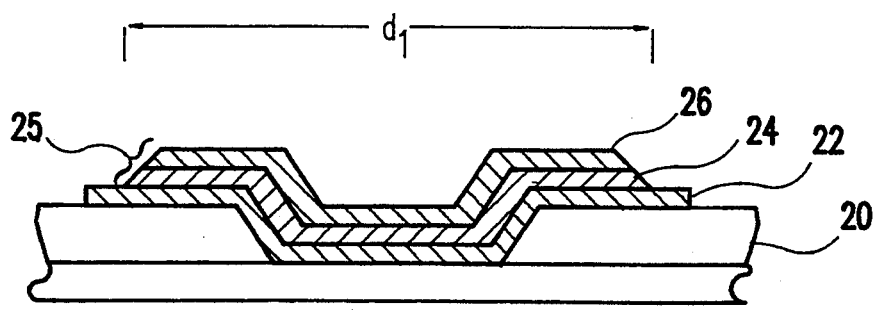
FIG. 3 is a cross-sectional side view of the stack of FIG. 2 after a first etch step performed using a thin photoresist mask.

FIG. 3 shows the first masking step uses a conventional thin photoresist mask to define a circular area having a diameter $d_1$. A conventional chemical or electro-chemical etch process is used to etch the wettable layer 26 and the phased layer 24 to form a frustum conical portion 25. The etching process selected will be a function of the particular metals used to make up the BLM layers.

Figure 4:
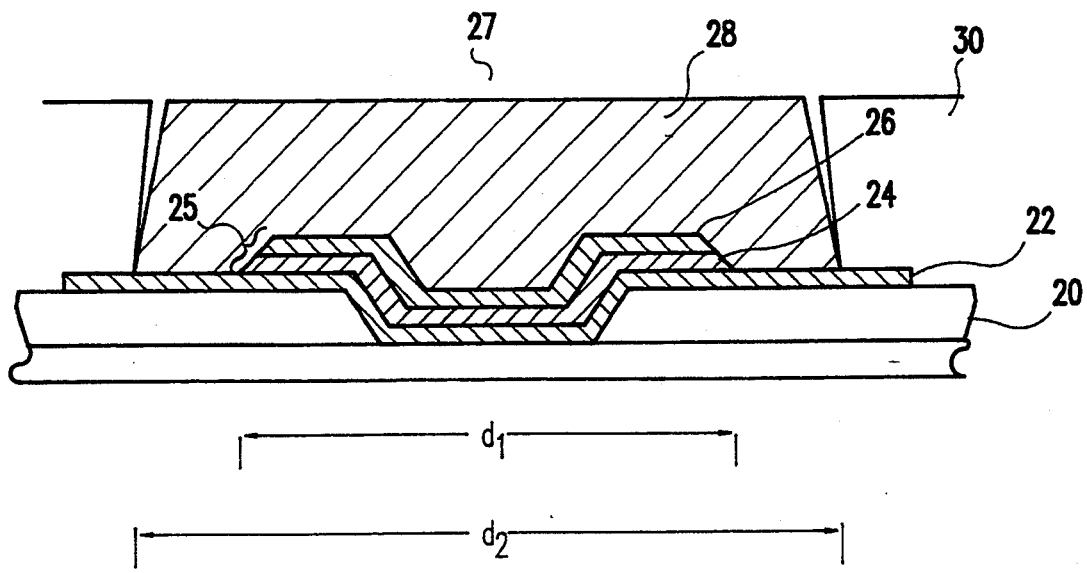
FIG. 4 is a cross-sectional side view of the stack of FIG. 3 after solder deposition.

FIG. 4 shows the second masking step includes applying a thick negative resist, exposing and developing the resist, to yield a hole 27 of diameter $d_2$ centered about the frustum conical portion 25 formed during the first masking step. The diameter $d_2$ of the hole 27 is larger than the diameter $d_1$ of the frustum conical portion 25. Solder 28 is then deposited into and fills hole 27. Solder 28 may be deposited by a number of conventional techniques including plating, vapor deposition, etc.

Figure 5:
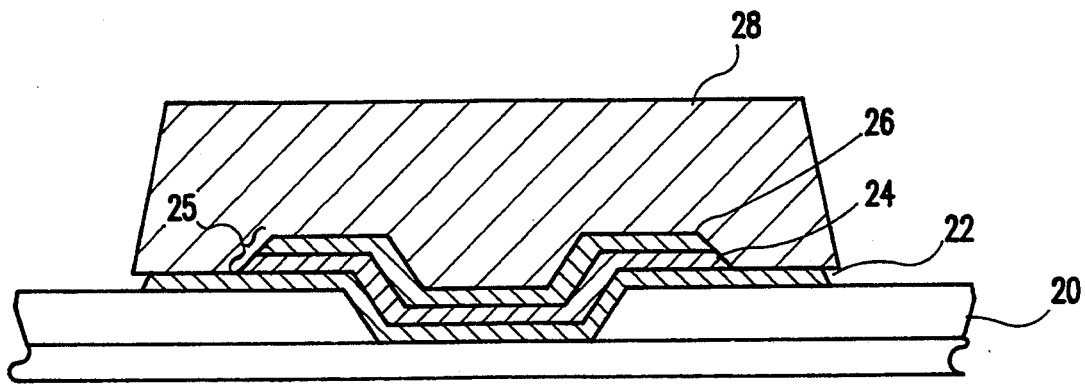
FIG. 5 is a cross-sectional side view of the stack of FIG. 4 after photoresist is removed and after a second etch step is performed.

FIG. 5 shows that the thick photoresist mask 30 is removed and the non-wettable layer 22 is then sub-etched by a suitable chemical or electrochemical etch process using the solder 28 as a mask. The non-wettable layer is etched to slightly undercut the solder 28.

Figure 6:
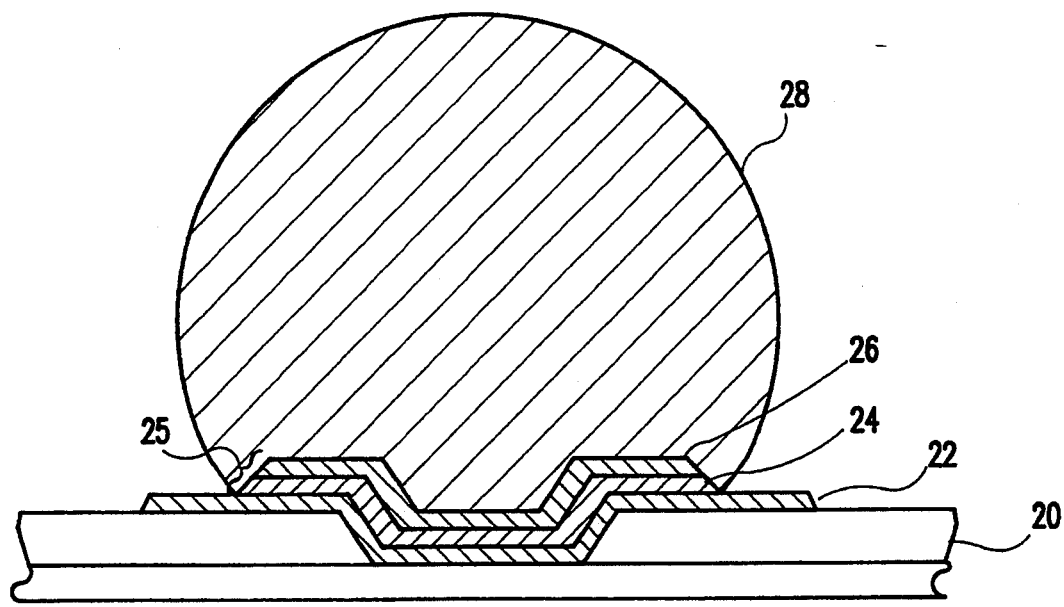
FIG. 6 is a cross-sectional side view of the solder ball over the BLM pad after solder has been reflowed.

FIG. 6 shows the solder 28 is subsequently reflowed (melted) after the non-wettable layer is etched. When molten, the solder 28 will tend to bead away from non-wettable layer 22 and will adhere with, and secure to, the frustum conical portion 25. The resultant structure has an edge separation of $d_2 - d_1$, resulting in reduced or eliminated edge stress responsible for joint failure in prior art joint interconnection structures. The degree of edge separation can be controlled simply by adjusting the relative sizes of the two masks used during the process.

The same steps described herein for forming a BLM pad on a supporting substrate are also applicable to forming BLM pads on semiconductor chips which are ultimately to be bonded to the support substrate.

While the invention has been described in terms of its preferred embodiments, those skilled in the art will recognize that the invention can be practiced with modification within the spirit and scope of the appended claims.

Having thus described my invention, what I claim as new and desire secure by Letters Patent is as follows:

1. A method of making a pad structure for a solder ball limiting metallurgy having reduced edge stress, comprising the steps of:

depositing sequentially first, second and third metal layers on a surface of a substrate to form a stack comprises of said first metal layer, said second metal layer and said third metal layer, said first metal layer adhering to said surface of said substrate and being solder non-wettable, said third metal layer being solder wettable, and said second layer being a phased metal composition of said first and said third metal layers;

selectively etching said second and said third metal layers to form at least one raised structure on said first metal layer comprised of said second and third metal layers;

depositing solder over said raised structure and a portion of said first metal layer positioned about a perimeter of said raised structure; and selectively etching said first metal layer from said surface of said substrate leaving at least one section of said first metal layer located under said solder.

2. A method of making a pad structure for a solder ball limiting metallurgy having reduced edge stress as recited in claim 1, further comprising the step of reflowing said solder to form a solder ball about said raised structure which beads away from said first metal layer.

3. A method of making a pad structure for a solder ball limiting metallurgy having reduced edge stress as recited in claim 1 further comprising the steps of:

defining a first area dimension for said raised structure with a first mask prior to said first etching step; and defining a second area dimension larger than said first area dimension for depositing said solder over said raised structure and said portion of said first metal layer with a second mask.

4. A method of making a pad structure for a solder ball limiting metallurgy having reduced edge stress as recited in claim 1 wherein said solder is deposited by a technique selected from the group consisting of plating and evaporation.

5. A method of making a pad structure for a solder ball limiting metallurgy having reducing edge stress as recited in claim 1 wherein said step of selectively etching said first metal layer slightly undercuts said solder.

6. A method of making a pad structure for a solder ball limiting metallurgy having reduced edge stress as recited in claim 1 wherein said step of selectively etching said second and third metal layers to form said raised structure yields a raised structure with a frustum conical shape.

7. A method of making a pad structure for a solder ball limiting metallurgy having reduced edge stress as recited in claim 1 wherein said first metal layer is selected from the group consisting of chromium, titanium, zirconium, molybdenum, tantalum, and alloys thereof.

8. A method of making a pad structure for a solder ball limiting metallurgy having reduced edge stress as recited in claim 1 wherein said third metal layer is selected from the group consisting of copper, cobalt, nickel, platinum, palladium, and alloys thereof.

* * * * *

UNITED STATES PATENT AND TRADEMARK OFFICE
CERTIFICATE OF CORRECTION

PATENT NO. : 5,376,584
DATED : December 27, 1994
INVENTOR(S) : Birendra N. Agarwala It is certified that error appears in the above-indentified patent and that said Letters Patent is hereby corrected as shown below:

On the title page, change the assignee from "International Business Machines Corporation, Reston, Va" to —International Business Machines Corporation, Armonk, NY.—

Signed and Sealed this

Eleventh Day of April, 1995

Attest:

BRUCE LEHMAN

Attesting Officer      Commissioner of Patents and Trademarks